US012593613B2

(12) United States Patent     (10) Patent No.:   US 12,593,613 B2

Eom et al.     (45) Date of Patent:     Mar. 31, 2026

(54) METHOD OF FABRICATING MEMORY DEVICE INCLUDING MAGNETIC TUNNEL JUNCTIONS WITH INSULATING SIDEWALLS

(71) Applicant: Samsung Electronics Co., Ltd., Suwon-si (KR)

(72) Inventors: Manjin Eom, Hwaseong-si (KR); Gawon Lee, Suwon-si (KR); Seungpil Ko, Hwaseong-si (KR); Kilho Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 607 days.

(21) Appl. No.: 18/145,228

(22) Filed: Dec. 22, 2022

(65) Prior Publication Data

US 2023/0217835 A1     Jul. 6, 2023

(30) Foreign Application Priority Data

Dec. 30, 2021    (KR) ........................ 10-2021-0193420

(51) Int. Cl.
*H10N 50/01*       (2023.01)
*H01J 37/305*      (2006.01)
          (Continued)

(52) U.S. Cl.
CPC ........... *H10N 50/01* (2023.02); *H01J 37/305* (2013.01); *H10B 61/00* (2023.02); *H10N 50/80* (2023.02)

(58) Field of Classification Search
CPC ........ H10N 50/01; H10N 50/80; H10B 61/00; H01J 37/305
         (Continued)

(56) References Cited

U.S. PATENT DOCUMENTS

| | | | | |
|---|---|---|---|---|
| 9,444,037 | B2 * | 9/2016 | Whig | ..................... H10N 50/01 |
| 9,608,040 | B2 * | 3/2017 | Baek | ..................... H01L 23/528 |

(Continued)

FOREIGN PATENT DOCUMENTS

| | | |
|---|---|---|
| KR | 2017-0027925 A | 3/2017 |
| KR | 2020/0043291 A | 4/2020 |

(Continued)

OTHER PUBLICATIONS

Office Action in Korean Appln. No. 10-2021-0193420, mailed on May 29, 2025, 12 pages (with English translation).

*Primary Examiner* — Jami Valentine Miller

(74) *Attorney, Agent, or Firm* — Fish & Richardson P.C.

(57) ABSTRACT

A method of manufacturing a memory device includes sequentially forming a first magnetization layer, a tunnel barrier layer, and a second magnetization layer on each other; forming a magnetic tunnel junction structure by patterning the first magnetization layer, the tunnel barrier layer, and the second magnetization layer; forming a sidewall metal layer by etching a portion of a redeposited metal covering a sidewall of the magnetic tunnel junction structure; performing an oxidizing operation that includes oxidizing an exposed surface of the sidewall metal layer to provide an oxidized sidewall metal layer; and performing an irradiating operation that includes irradiating an ion beam towards the oxidized sidewall metal layer. A sidewall insulating layer covering a sidewall of the magnetic tunnel junction structure is formed by alternately performing the oxidizing operation and the irradiating operation two or more times.

20 Claims, 18 Drawing Sheets

(51) Int. Cl.
    *H10B 61/00*        (2023.01)
    *H10N 50/80*        (2023.01)

(58) Field of Classification Search
    USPC ............................................................ 438/3
    See application file for complete search history.

(56) References Cited

U.S. PATENT DOCUMENTS

| | | | |
|---|---|---|---|
| 9,876,165 B2 * | 1/2018 | Kim ...................... | H10N 50/85 |
| 10,134,981 B1 * | 11/2018 | Yang ..................... | G11C 11/161 |
| 10,199,566 B2 * | 2/2019 | Oh ......................... | H10N 50/01 |
| 10,205,089 B2 | 2/2019 | Kim et al. | |
| 10,516,102 B1 | 12/2019 | Yang et al. | |
| 11,031,548 B2 | 6/2021 | Shen et al. | |
| 2013/0234268 A1 * | 9/2013 | Kariyada ............... | H10N 50/01 |
| | | | 257/421 |
| 2016/0118578 A1 | 4/2016 | Park et al. | |
| 2017/0358739 A1 | 12/2017 | Kim et al. | |
| 2020/0403151 A1 * | 12/2020 | Annunziata ............ | H10N 50/10 |
| 2021/0376232 A1 | 12/2021 | Wang et al. | |
| 2022/0028441 A1 * | 1/2022 | Tsubata .................. | H10B 61/00 |
| 2022/0367789 A1 * | 11/2022 | Chuang ................... | H10N 50/01 |
| 2023/0217835 A1 * | 7/2023 | Eom ....................... | H01J 37/305 |
| | | | 438/3 |

FOREIGN PATENT DOCUMENTS

| | | |
|---|---|---|
| KR | 2020/0062342 A | 6/2020 |
| KR | 2021/0082499 A | 7/2021 |

* cited by examiner

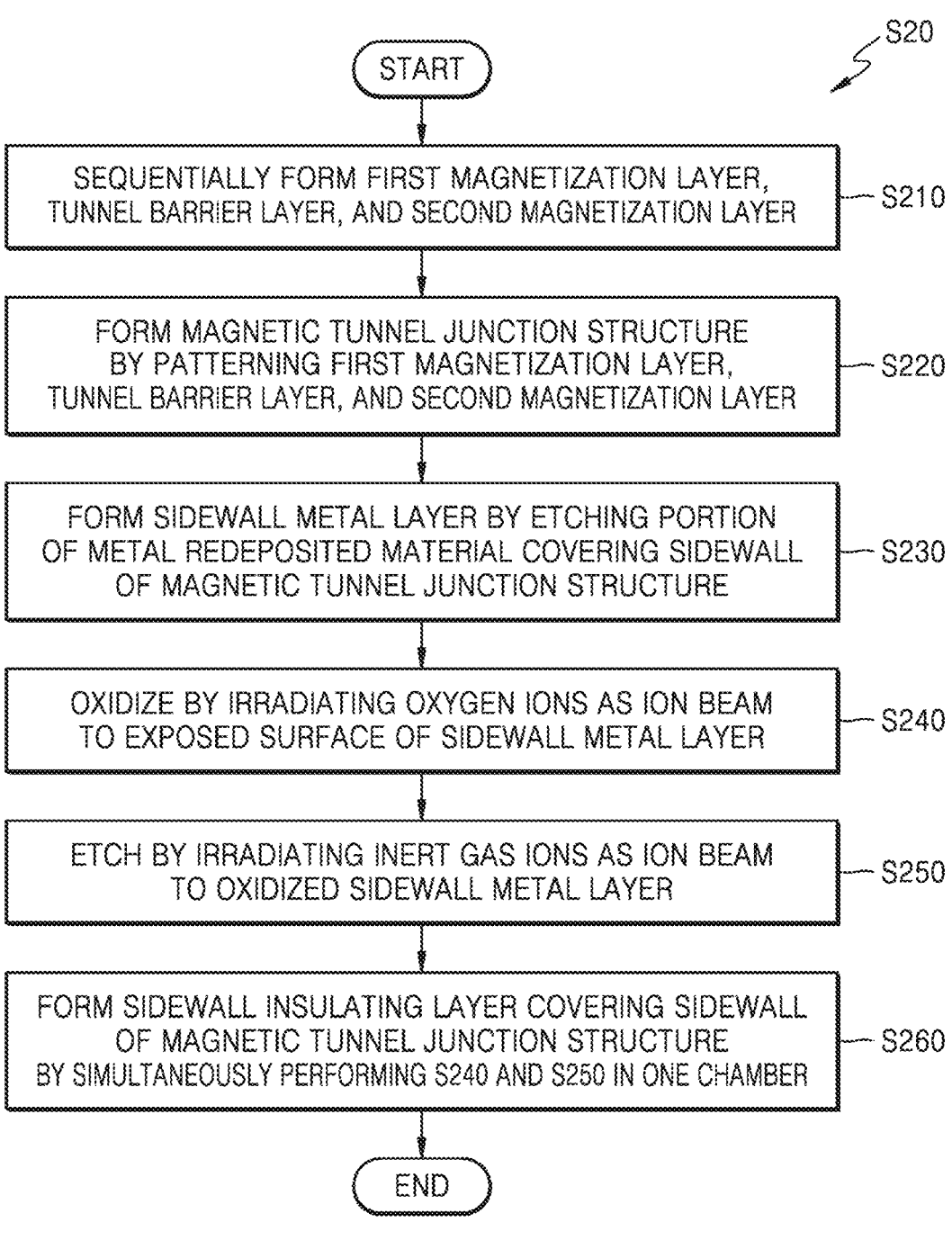

S20

START

SEQUENTIALLY FORM FIRST MAGNETIZATION LAYER, TUNNEL BARRIER LAYER, AND SECOND MAGNETIZATION LAYER — S210

FORM MAGNETIC TUNNEL JUNCTION STRUCTURE BY PATTERNING FIRST MAGNETIZATION LAYER, TUNNEL BARRIER LAYER, AND SECOND MAGNETIZATION LAYER — S220

FORM SIDEWALL METAL LAYER BY ETCHING PORTION OF METAL REDEPOSITED MATERIAL COVERING SIDEWALL OF MAGNETIC TUNNEL JUNCTION STRUCTURE — S230

OXIDIZE BY IRRADIATING OXYGEN IONS AS ION BEAM TO EXPOSED SURFACE OF SIDEWALL METAL LAYER — S240

ETCH BY IRRADIATING INERT GAS IONS AS ION BEAM TO OXIDIZED SIDEWALL METAL LAYER — S250

FORM SIDEWALL INSULATING LAYER COVERING SIDEWALL OF MAGNETIC TUNNEL JUNCTION STRUCTURE BY SIMULTANEOUSLY PERFORMING S240 AND S250 IN ONE CHAMBER — S260

END

FIG. 13

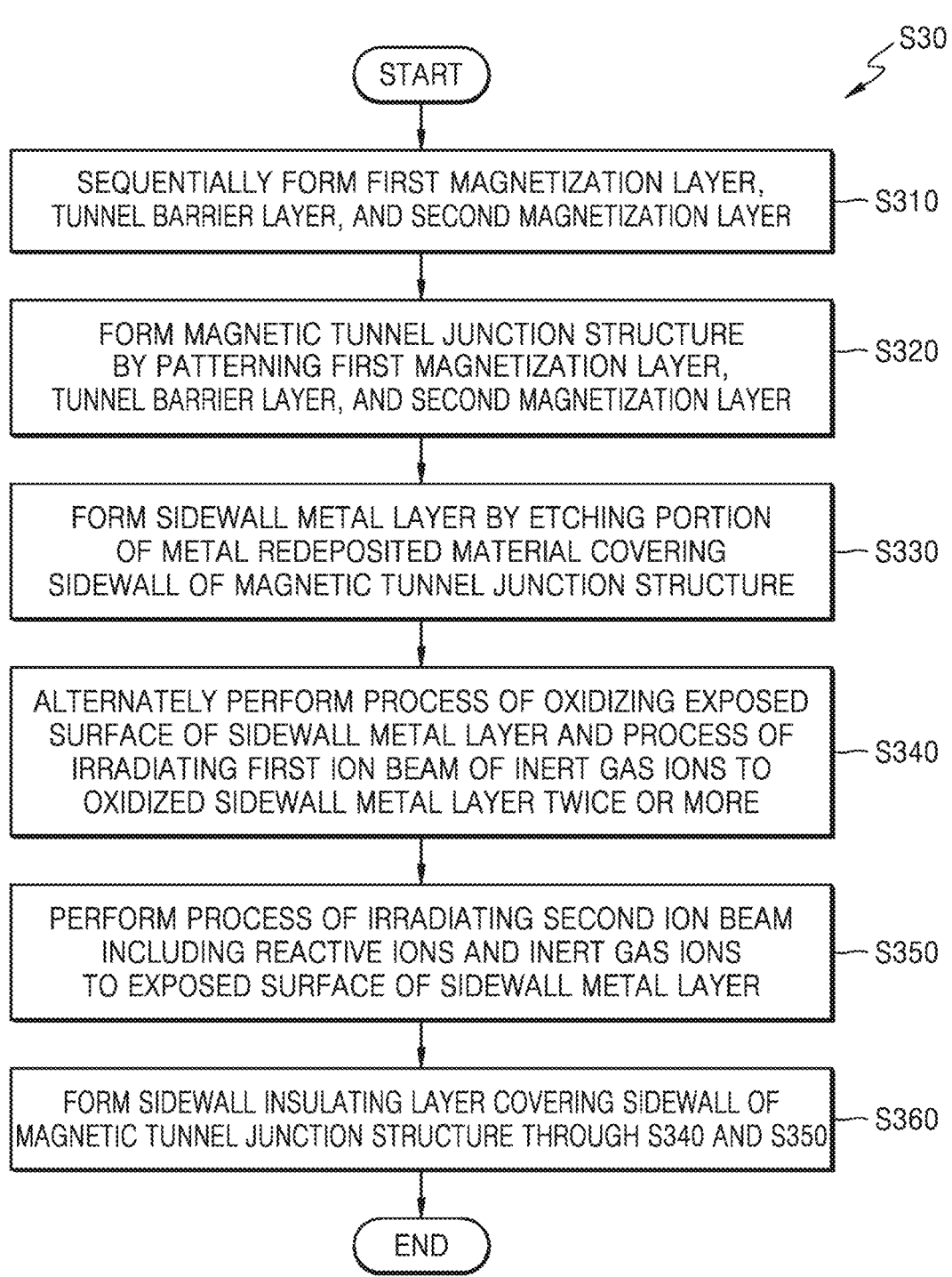

START

S30

SEQUENTIALLY FORM FIRST MAGNETIZATION LAYER, TUNNEL BARRIER LAYER, AND SECOND MAGNETIZATION LAYER — S310

FORM MAGNETIC TUNNEL JUNCTION STRUCTURE BY PATTERNING FIRST MAGNETIZATION LAYER, TUNNEL BARRIER LAYER, AND SECOND MAGNETIZATION LAYER — S320

FORM SIDEWALL METAL LAYER BY ETCHING PORTION OF METAL REDEPOSITED MATERIAL COVERING SIDEWALL OF MAGNETIC TUNNEL JUNCTION STRUCTURE — S330

ALTERNATELY PERFORM PROCESS OF OXIDIZING EXPOSED SURFACE OF SIDEWALL METAL LAYER AND PROCESS OF IRRADIATING FIRST ION BEAM OF INERT GAS IONS TO OXIDIZED SIDEWALL METAL LAYER TWICE OR MORE — S340

PERFORM PROCESS OF IRRADIATING SECOND ION BEAM INCLUDING REACTIVE IONS AND INERT GAS IONS TO EXPOSED SURFACE OF SIDEWALL METAL LAYER — S350

FORM SIDEWALL INSULATING LAYER COVERING SIDEWALL OF MAGNETIC TUNNEL JUNCTION STRUCTURE THROUGH S340 AND S350 — S360

END

METHOD OF FABRICATING MEMORY DEVICE INCLUDING MAGNETIC TUNNEL JUNCTIONS WITH INSULATING SIDEWALLS

CROSS-REFERENCE TO RELATED APPLICATION

This application is based on and claims priority under 35 U.S.C. § 119 to Korean Patent Application No. 10-2021-0193420, filed on Dec. 30, 2021 in the Korean Intellectual Property Office, the disclosure of which is incorporated by reference herein in its entirety.

BACKGROUND

Inventive concepts relate to a method of manufacturing a memory device, and more particularly, to a method of manufacturing a memory device by including a process of forming a magnetic tunnel junction structure.

Much research has been done on a memory device using the magnetoresistance characteristic of a magnetic tunnel junction (MTJ). In particular, a highly integrated magnetic memory device is emerging as a next-generation memory device because of characteristics such as high-speed read and high-speed write operations and non-volatile properties. However, such a magnetic memory device contains a transition metal having magnetism not used in conventional semiconductor memory devices, and an electrical short defect may occur in the magnetic tunnel junction structure due to an etching by-product generated during the process of etching the magnetic transition metal.

SUMMARY

Inventive concepts provide a method of manufacturing a memory device wherein an electrical short defect is limited and/or prevented from occurring due to an etching by-product of a sidewall of a magnetic tunnel junction structure.

Inventive concepts are not limited to the features mentioned above, and other aspects, features, and/or advantages not mentioned will be clearly understood by those skilled in the art from the following description.

According to an embodiment of inventive concepts, a method of manufacturing a memory device may include sequentially forming a first magnetization layer, a tunnel barrier layer, and a second magnetization layer on each other; forming a magnetic tunnel junction structure by patterning the first magnetization layer, the tunnel barrier layer, and the second magnetization layer, the forming the magnetic tunnel junction structure including forming a redeposited metal covering a sidewall of the magnetic tunnel junction structure; forming a sidewall metal layer by etching a portion of the redeposited metal; performing an oxidizing operation that includes oxidizing an exposed surface of the sidewall metal layer to provide an oxidized sidewall metal layer; and performing an irradiating operation that includes irradiating an ion beam toward the oxidized sidewall metal layer. A sidewall insulating layer may cover a sidewall of the magnetic tunnel junction structure and may be formed by alternately performing the oxidizing operation and the irradiating operation two or more times.

According to an embodiment of inventive concepts, a method of manufacturing a memory device may include sequentially forming a first magnetization layer, a tunnel barrier layer, and a second magnetization layer on each other; forming a magnetic tunnel junction structure by patterning the first magnetization layer, the tunnel barrier layer, and the second magnetization layer, the forming the magnetic tunnel junction structure including forming a redeposited metal covering a sidewall of the magnetic tunnel junction structure; forming a sidewall metal layer by etching a portion of a redeposited metal; performing an oxidizing operation that includes oxidizing an exposed surface of the sidewall metal layer by irradiating an ion beam of oxygen ions toward the exposed surface of the sidewall metal layer to provide an oxidized sidewall metal layer; and etching the oxidized sidewall metal layer by irradiating an ion beam of inert gas ions toward the oxidized sidewall metal layer. The performing the oxidizing operation and the performing etching operation may be performed in one chamber at a same time to form a sidewall insulating layer covering the sidewall of the magnetic tunnel junction structure.

According to an embodiment of inventive concepts, a method of manufacturing a memory device may include sequentially forming a first magnetization layer, a tunnel barrier layer, and a second magnetization layer on each other; forming a magnetic tunnel junction structure by patterning the first magnetization layer, the tunnel barrier layer, and the second magnetization layer, the forming the magnetic tunnel junction structure including forming a redeposited metal covering a sidewall of the magnetic tunnel junction structure; forming a sidewall metal layer by etching a portion of the redeposited metal; and forming a sidewall insulating layer covering the sidewall of the magnetic tunnel junction structure by oxidizing the sidewall metal layer. The forming the sidewall insulating layer may include alternately performing a process of oxidizing of an exposed surface of the sidewall metal layer to provide an oxidized sidewall of the metal layer and a process of irradiating the oxidized sidewall of the metal layer with a first ion beam of inert gas ions. The forming the sidewall insulating layer, after the alternately performing the process of oxidizing and the process of irradiating is performed two or more times, may further include an operation of irradiating the exposed surface of the sidewall metal layer with a second ion beam including reactive ions and inert gas ions.

BRIEF DESCRIPTION OF THE DRAWINGS

Embodiments of inventive concepts will be more clearly understood from the following detailed description taken in conjunction with the accompanying drawings in which:

FIGS. 3 to 8 are cross-sectional views illustrating a method of manufacturing a memory device according to an example embodiment of inventive concepts;

FIG. 9 is a flowchart illustrating a method of manufacturing a memory device according to another embodiment of inventive concepts;

FIG. 13 is a flowchart illustrating a method of manufacturing a memory device according to still another embodiment of inventive concepts;

Figure 15:
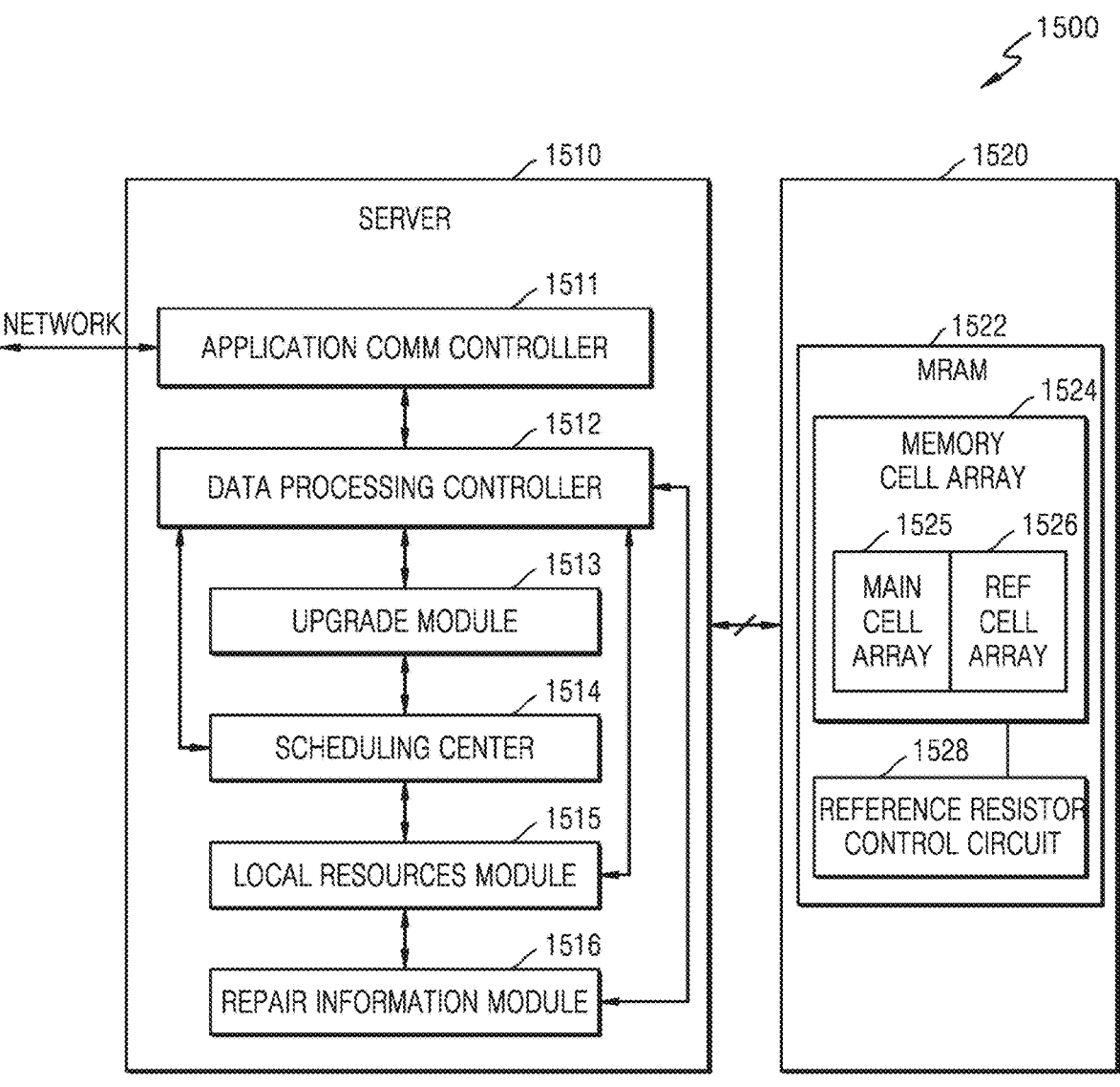

3 by a method of manufacturing a memory device according to an embodiment of inventive concepts; and FIG. 15 is a block diagram illustrating a server system including a magnetic memory device manufactured by a method of manufacturing a memory device according to an embodiment of inventive concepts.

DETAILED DESCRIPTION

Hereinafter, embodiments of inventive concepts will be described in detail with reference to the accompanying drawings.

Figure 1:
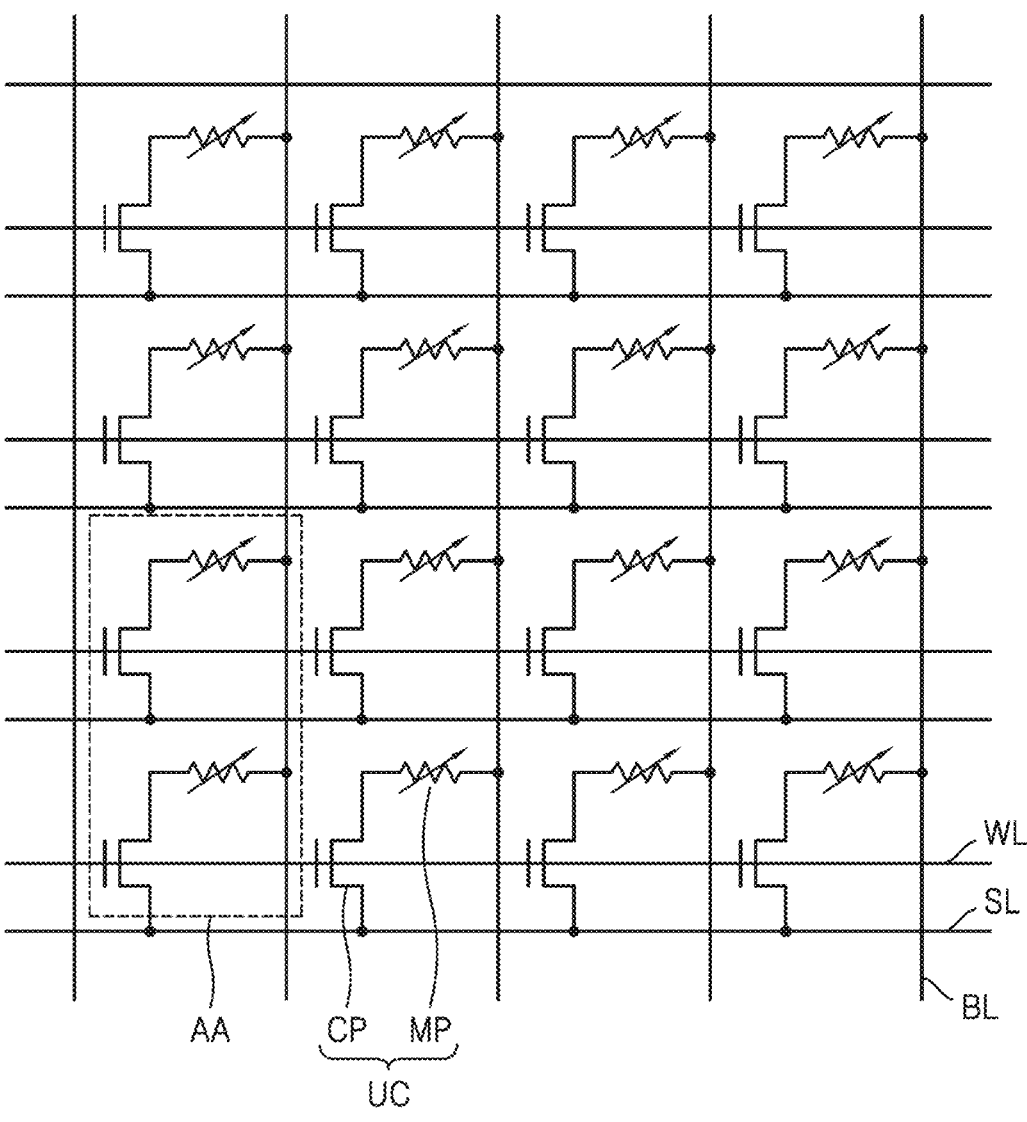
FIG. 1 is a schematic diagram illustrating a magnetic memory array according to an embodiment of inventive concepts.

FIG. 1 is a schematic diagram illustrating a magnetic memory array according to an embodiment of inventive concepts.

Referring to FIG. 1, the magnetic memory array includes unit cells UC of a plurality of magnetic memory devices arranged in a matrix form.

The unit cell UC of the plurality of magnetic memory devices includes an access portion CP and a memory portion MP. The unit cells UC of the plurality of magnetic memory devices are electrically connected to the word line WL and the bit line BL. In addition, as illustrated, when the access portion CP is a transistor, it may further include a source line SL electrically connected to the source region of the access portion CP. The word line WL and the bit line BL may be arranged at a desired and/or alternatively preset angle, for example, perpendicular to each other. Also, the word line WL and the source line SL may be arranged at a desired and/or alternatively preset angle, for example, parallel to each other.

The access portion CP controls the supply of current to the memory portion MP according to the voltage of the word line WL. The access portion CP is a selection element, and may be a complementary metal-oxide semiconductor (CMOS) transistor, a bipolar transistor, or a diode.

The memory portion MP may include a magnetic material and may have a magnetic tunnel junction (MTJ) structure. In addition, the memory portion MP may perform a memory function by using a spin transfer torque (STT) phenomenon in which a magnetization direction of a magnetic material is changed according to an input current.

Hereinafter, an MTJ structure and/or a method of manufacturing a memory device including the same according to example embodiments of inventive concepts will be described.

Figure 2:
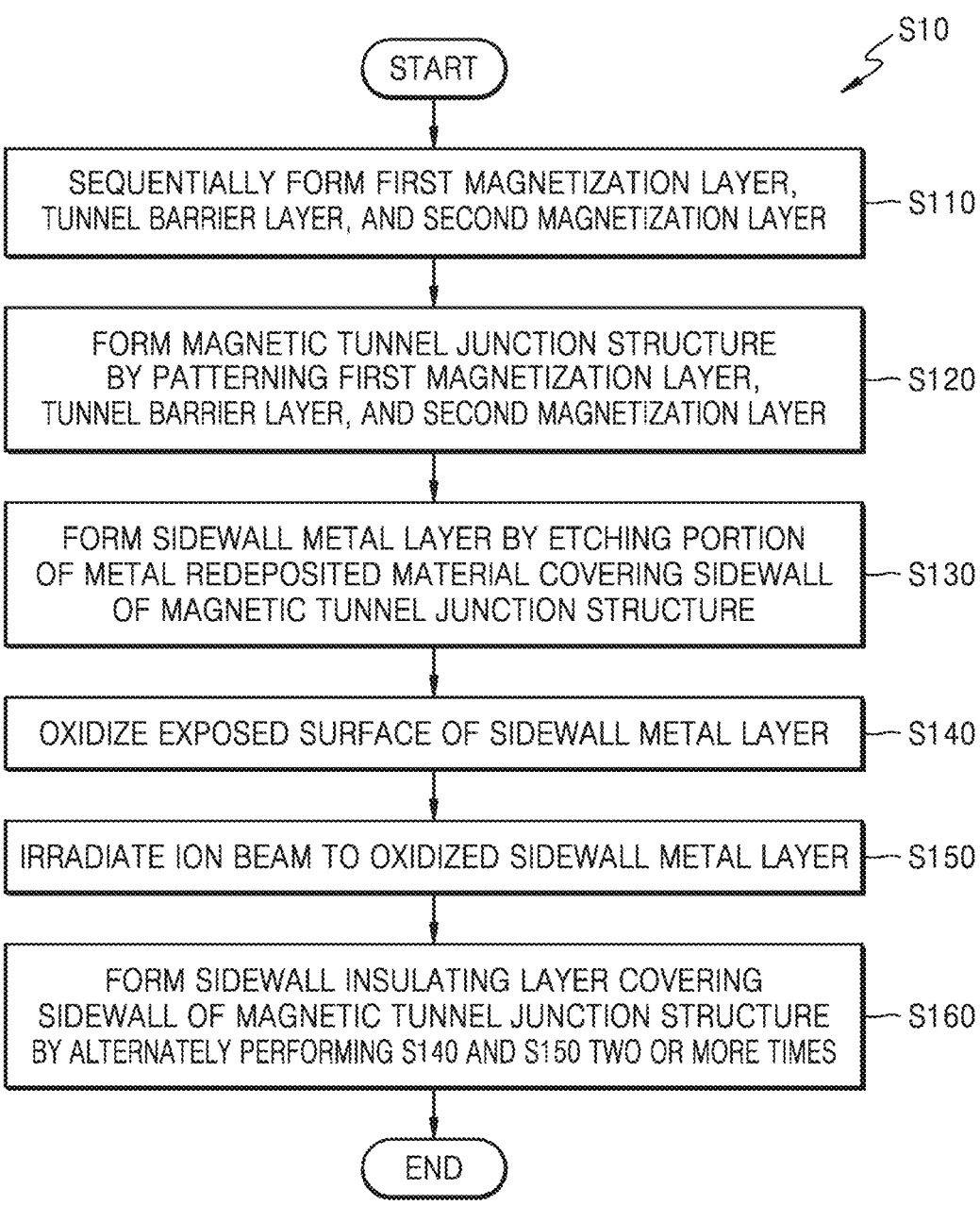
FIG. 2 is a flowchart illustrating a method of manufacturing a memory device according to an embodiment of inventive concepts.

FIG. 2 is a flowchart illustrating a method of manufacturing a memory device according to an embodiment of inventive concepts.

Referring to FIG. 2, s method S10 of manufacturing a memory device according to an embodiment of inventive concepts may include the process sequence of first to sixth operations S110 to S160.

When a certain embodiment may be implemented differently, a particular process order may be performed differently from the described order. For example, two processes described in succession may be performed substantially simultaneously, or may be performed in an order opposite to the described order.

The manufacturing method S10 of the memory device according to an embodiment of inventive concepts may include a first operation S110 of sequentially forming a first magnetization layer, a tunnel barrier layer, and a second magnetization layer, a second operation S120 of forming an MTJ structure by patterning the first magnetization layer, the tunnel barrier layer, and the second magnetization layer, a third operation S130 of forming a sidewall metal layer by etching a portion of the metal redeposited material covering the sidewall of the MTJ structure, a fourth operation S140 of oxidizing the exposed surface of the sidewall metal layer, a fifth operation S150 of irradiating an ion beam to the oxidized sidewall metal layer, and a sixth operation S160 of forming a sidewall insulating layer covering the sidewall of the MTJ structure by alternately performing the fourth operation S140 and the fifth operation S150 two or more times.

Technical characteristics for each of the first to sixth operations S110 to S160 will be described in detail with reference to FIGS. 3 to 8 to be described later.

FIGS. 3 to 8 are cross-sectional views illustrating a method of manufacturing a memory device according to an example embodiment of inventive concepts. FIGS. 3 to 8 show a method of manufacturing the magnetic memory device of a portion AA of FIG. 1.

Figure 3:
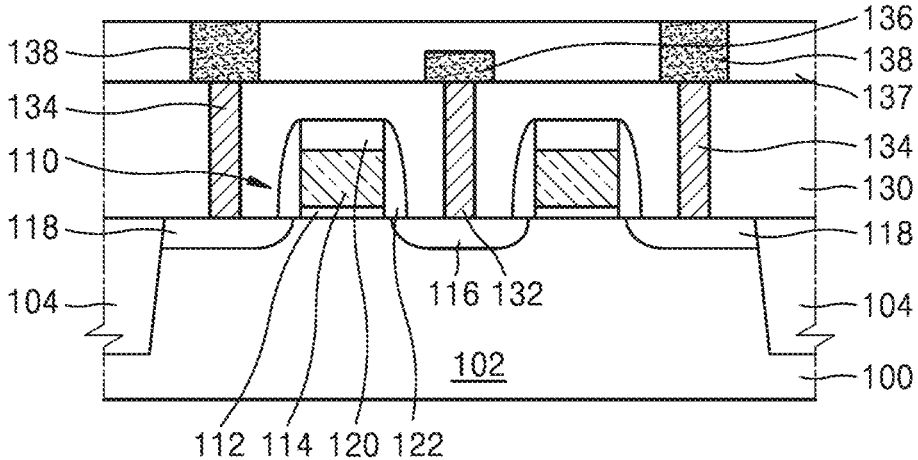

Referring to FIGS. 3 and 1 together, the device isolation film 104 may be formed on the substrate 100 to define an active region 102, and the transistor 110 may be formed in the active region 102.

The magnetic memory device 10 (refer to FIG. 8) may include an MTJ structure MS (see FIG. 8) and a transistor 110. A gate of the transistor 110 may be connected to a word line WL. One electrode of the transistor 110 may be connected to a bit line BL through an MTJ structure MS (see FIG. 8), and the other electrode of the transistor 110 may be connected to a source line SL.

First, a manufacturing process of the transistor 110 will be described. The substrate 100 is a semiconductor wafer such as a silicon (Si) substrate, a germanium (Ge) substrate, a silicon carbide (SiC) substrate, a gallium arsenide (GaAs) substrate, an indium arsenide (InAs) substrate, or an indium phosphorus (InP) substrate. In some embodiments, the substrate 100 may include a well doped with an impurity that is a conductive region or a structure doped with an impurity. In addition, the device isolation film 104 may have a shallow trench isolation (STI) structure.

The transistor 110 may include a gate insulating film 112, a gate electrode 114, a source region 116, and a drain region 118. The gate electrode 114 may be formed such that an upper surface and both sidewalls of the gate electrode 114 are insulated by the insulating capping pattern 120 and the insulating spacer 122, respectively.

A first interlayer insulating film 130 covering the transistor 110 may be formed on the substrate 100, and a first contact plug 132 electrically connected to the source region 116 and a second contact plug 134 electrically connected to the drain region 118 may be formed through the first interlayer insulating film 130. After forming a conductive layer (not shown) on the first interlayer insulating film 130, the conductive layer is patterned, such that a source line 136 electrically connected to the source region 116 through a plurality of first contact plugs 132 and lower electrodes 138 electrically connected to the drain regions 118 through the second contact plugs 134 at both sides of the source line 136 may be formed.

Next, a lower insulating film 137 may be formed on the first interlayer insulating film 130 to cover the source line 136 and the lower electrode 138. A portion of the lower insulating film 137 may be removed to expose an upper surface of the lower electrode 138.

The lower electrode 138 is to be electrically connected to an MTJ structure MS (see FIG. 8) formed in a subsequent process. For example, the lower electrode 138 may be formed in the form of an isolated pattern, in the form of a film, in the form of a contact plug, or in the form of a cylinder having an upper surface with a ring shape.

Figure 4:
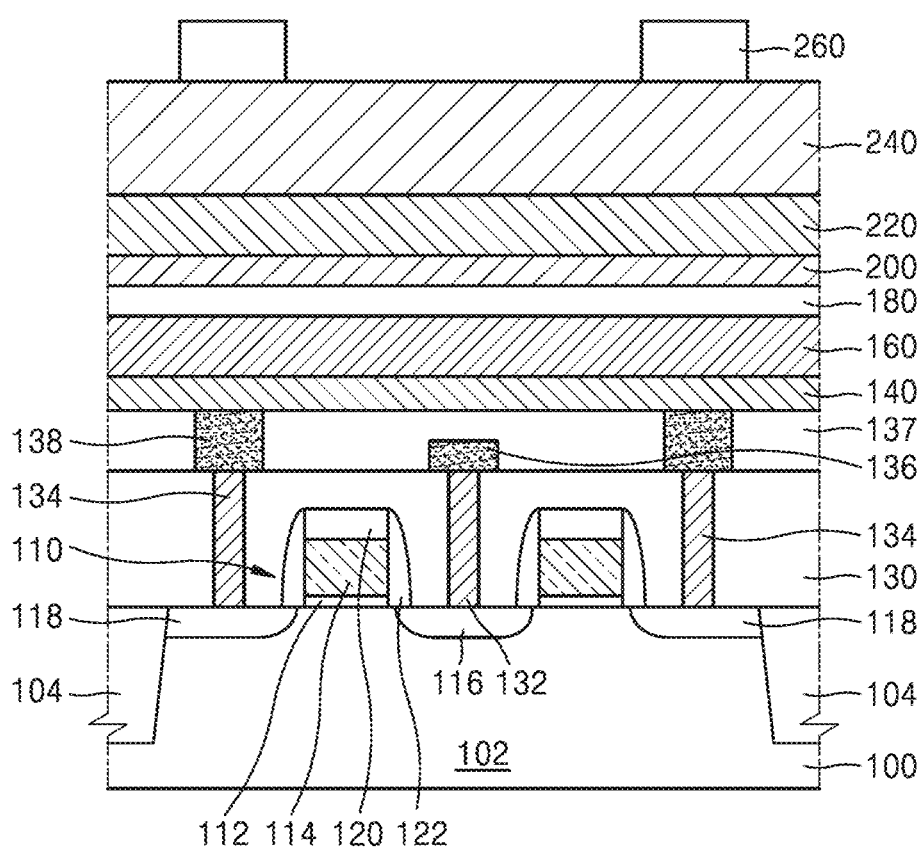

Referring to FIG. 4, a first electrode layer 140, a first magnetization layer 160, a tunnel barrier layer 180, a second magnetization layer 200, a capping film 220, and an upper electrode layer 240 are formed sequentially on the lower insulating film 137 and the lower electrode 138.

The first electrode film 140 may include a metal material. The metal material that may be used as the first electrode film 140 may be, for example, titanium (Ti), titanium nitride (TiN), tantalum (Ta), tantalum nitride (TaN), or the like. The first electrode film 140 may be formed by forming the metal material alone or by stacking two or more. The first electrode film 140 is a pad film arranged between the first magnetization layer 160 and the lower electrode 138 to be formed in a subsequent process, and may protect the first magnetization layer 160. In addition, the first electrode film 140 may be used to perform the same role as the lower electrode 138 through a subsequent process. In other embodiments, the first electrode film 140 may not be formed.

The first magnetization layer 160 may include a magnetic material including a transition metal. The first magnetization layer 160 may be formed so that the magnetization direction is vertical. In some embodiments, the first magnetization layer 160 may be a fixed layer in which the magnetization direction is fixed to one vertical direction. The first magnetization layer 160 may include at least one of palladium (Pd), cobalt (Co), platinum (Pt), iron (Fe), ruthenium (Ru), tantalum (Ta), nickel (Ni), boron (B), manganese (Mn), antimony (Sb), aluminum (Al), chromium (Cr), molybdenum (Mo), silicon (Si), copper (Cu), iridium (Ir), and alloys thereof. A material that may be used as the first magnetization layer 160 may be, for example, cobalt iron (CoFe), nickel iron (NiFe), or cobalt iron boron (CoFeB). The first magnetization layer 160 may be formed alone or by stacking two or more thereof. The first magnetization layer 160 may be formed to be thicker than other films in the MTJ structure to form a film with good orientation and reduced crystal defects.

The tunnel barrier layer 180 may include an insulating metal oxide. The tunnel barrier layer 180 may include magnesium oxide (MgO) or aluminum oxide ($AlO_x$). The tunnel barrier layer 180 is formed so that quantum tunneling may occur between the first magnetization layer 160 and the second magnetization layer 200. The tunnel barrier layer 180 may have a thin thickness of about 1 Å to about 100 Å. However, the thickness of the tunnel barrier layer 180 is not limited to the above.

The second magnetization layer 200 may include a magnetic material including a transition metal. The second magnetization layer 200 may be formed as a free layer whose magnetization direction may be changed in a vertical direction. The second magnetization layer 200 may include at least one of palladium (Pd), cobalt (Co), platinum (Pt), iron (Fe), ruthenium (Ru), tantalum (Ta), nickel (Ni), boron (B), manganese (Mn), antimony (Sb), aluminum (Al), chromium (Cr), molybdenum (Mo), silicon (Si), copper (Cu), iridium (Ir), and alloys thereof. A material that may be used as the second magnetization layer 200 may be, for example, cobalt iron (CoFe), nickel iron (NiFe), or cobalt iron boron (CoFeB). The second magnetization layer 200 may be formed alone or by stacking two or more thereof.

In some embodiments, the second magnetization layer 200 formed as a free layer may be formed to have a thickness smaller than that of the first magnetization layer 160. The sum of the thicknesses of the first magnetization layer 160, the tunnel barrier layer 180, and the second magnetization layer 200 may be about 150 Å to about 400 Å. However, the sum of the thicknesses of the first magnetization layer 160, the tunnel barrier layer 180, and the second magnetization layer 200 is not limited to the above.

In the embodiment of inventive concepts, it will be described that the first magnetization layer 160 is formed as a fixed layer, and the second magnetization layer 200 is formed as a free layer. However, inventive concepts are not limited thereto, and one of the first magnetization layer 160 and the second magnetization layer 200 may be formed as a fixed layer, and the other one may be formed as a free layer. Therefore, in other embodiments, the first magnetization layer 160 may be formed as a free layer, and the second magnetization layer 200 may be formed as a fixed layer.

In addition, in the embodiment of inventive concepts, the first magnetization layer 160 and the second magnetization layer 200 will be described as a material that is magnetized in a vertical direction. However, inventive concepts are not limited thereto, and the first magnetization layer 160 and the second magnetization layer 200 may be materials that are magnetized in a horizontal direction. In this case, at least one layer selected from the group consisting of platinum manganese (PtMn), iridium manganese (IrMn), iron platinum (FePt), and cobalt platinum (CoPt) may be formed below the first magnetization layer 160, and a layer including cobalt iron (CoFe), nickel iron (NiFe), or cobalt iron boron (CoFeB) may be formed on the first magnetization layer 160. Even when the first magnetization layer 160 and the second magnetization layer 200 are materials that are magnetized in the horizontal direction, the MTJ structure may be formed by performing the same processes described below.

A material that may be used as the capping film 220 may be, for example, titanium (Ti), titanium nitride (TiN), tantalum (Ta), or tantalum nitride (TaN). The capping film 220 may be formed alone or by stacking two or more thereof.

The upper electrode film 240 may include a metal or a metal nitride. A material that may be used as the upper electrode film 240 may be, for example, tungsten (W), tungsten nitride (WN), or the like. The upper electrode film 240 may be formed to be thicker than the upper contact plug 270 (refer to FIG. 8 to be formed on the upper electrode film 240. In addition, the upper electrode film 240 may be formed to be thicker than the capping film 220.

Next, a hard mask pattern 260 is formed on the upper electrode film 240. In particular, the process of forming the hard mask pattern 260 is as follows. A hard mask is formed on the upper electrode film 240, a photoresist (not shown) is coated on the hard mask, and a photoresist pattern (not shown) is formed through exposure and development processes. By using the photoresist pattern, the hard mask is etched to form a hard mask pattern 260. The hard mask pattern 260 may include silicon nitride or silicon oxynitride.

The hard mask pattern 260 may be formed through a double patterning technology (DPT) or a quadruple patterning technology (QPT). The hard mask pattern 260 is disposed to face the lower electrode 138 in a vertical direction. The hard mask pattern 260 may be disposed to cover the upper surface of the lower electrode 138.

Figure 5:
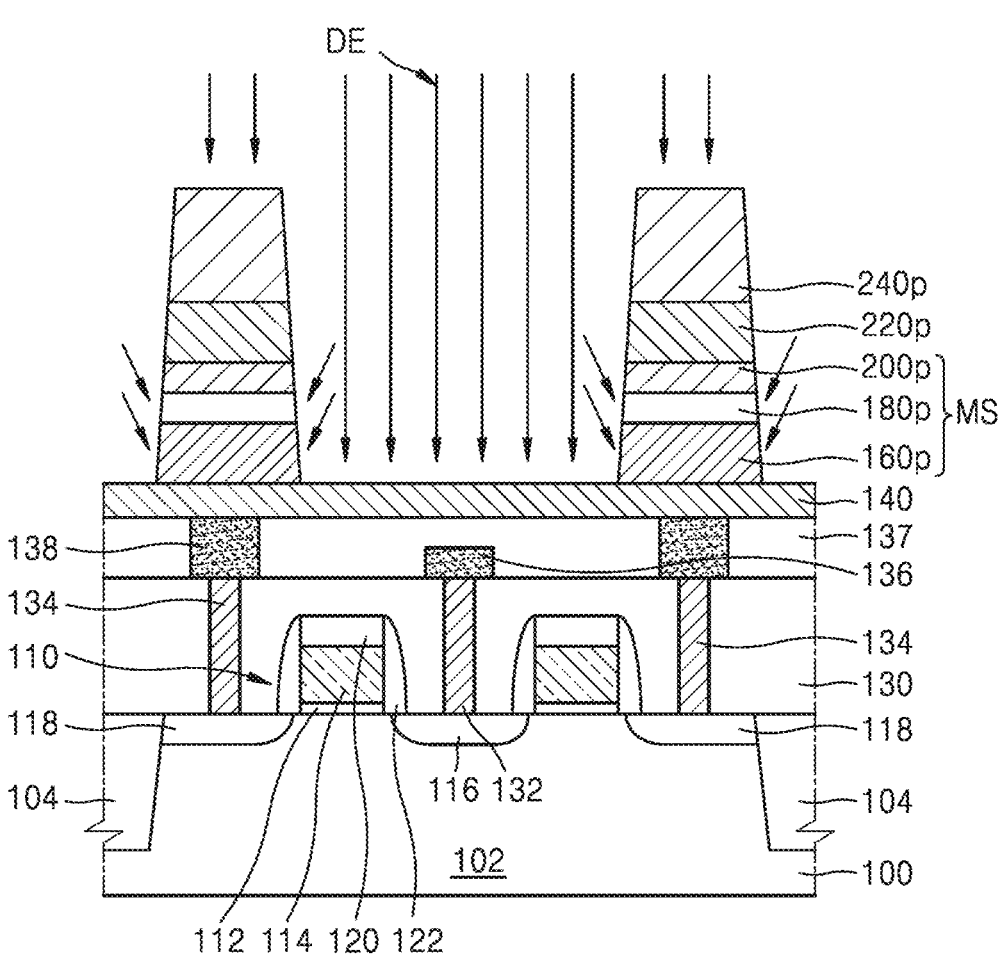

Referring to FIG. 5, the upper electrode film 240 (refer to FIG. 4) is patterned using the hard mask pattern 260 as an etch mask to form an upper electrode pattern 240p.

Subsequently, the capping film 220 (refer to FIG. 4) is etched to form a capping pattern 220p. When the etching process is completed, the hard mask pattern 260 (refer to FIG. 4) may be mostly removed or completely removed. Residues of the hard mask pattern 260 remaining after the etching process are removed.

Since the upper electrode film 240 and the capping film 220 do not include a magnetic material, they may be easily etched through the etching process, and the problem of redepositing the etching by-products hardly occurs during the etching process. In relation to the upper electrode film 240 and the capping film 220, the etching may be performed using a reactive ion etching (RIE) process using an etching gas or an ion beam etching (IBE) process using an ion beam irradiation.

Next, using the upper electrode film 240 as a hard mask pattern, a second magnetization layer 200 (refer to FIG. 4), a tunnel barrier layer 180 (refer to FIG. 4), and a first magnetization layer 160 (refer to FIG. 4) are sequentially etched. Accordingly, a first magnetization pattern 160*p*, a tunnel barrier pattern 180*p*, and a second magnetization pattern 200*p* are respectively formed. Hereinafter, the second magnetization layer 200, the tunnel barrier layer 180, and the first magnetization layer 160 are referred to as an etch target film. In addition, the first magnetization pattern 160*p*, the tunnel barrier pattern 180*p*, and the second magnetization pattern 200*p* are referred to as an MTJ structure MS.

The etch target film may be etched through a reactive ion etching process that is a dry etching process DE or an IBE process. In some embodiments, the gas used in the reactive ion etching process may be an etching gas including hydrogen fluoride (HF) and/or ammonia ($NH_3$). In other embodiments, the etching process may be an IBE process such as argon (Ar) ion sputtering. In the case of the IBE process, unlike the reactive ion etching process, a separate etching gas may not be used.

Since the etch target film includes a magnetic material, it may be difficult to be easily etched through a dry etching process DE, and an etching by-product may be redeposited during the etching process. Therefore, when performing a reactive ion etching process or an IBE process that is a physical etching process on the etch target film, compared to the case without magnetic material, the process may proceed by using reactive ions or ion beams with stronger etching performance.

In addition, even in an anisotropic etching process such as a dry etching process DE, due to the interference between reactive ions in the actual etching process, or the positional relationship between the incident angle of the ion beam and the substrate 100, it may be difficult to etch the etch target film only in the vertical direction. That is, etching may proceed in a direction not perpendicular to the etch target film. A direction in which the dry etching process DE proceeds is indicated by an arrow.

Figure 6:
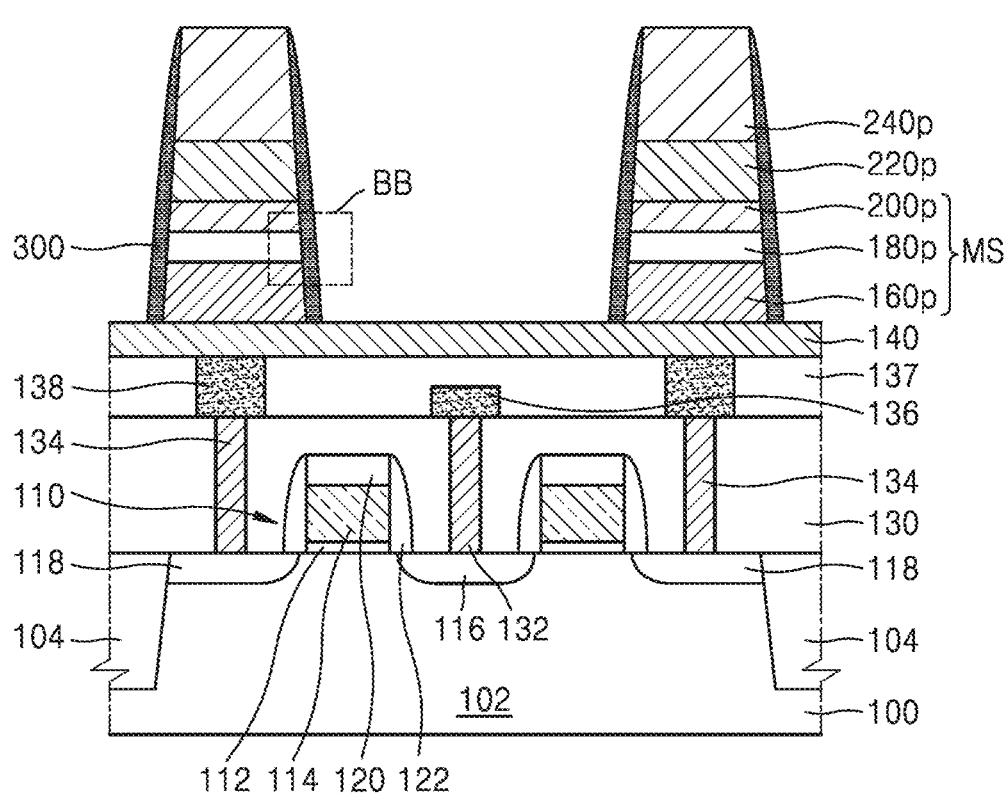

Referring to FIG. 6, when the etch target film including the magnetic material is etched, a portion of the etched material may be redeposited on the sidewall of the pattern structure including the MTJ structure MS.

In particular, etching by-products may be redeposited on the sidewall of the pattern structure including the MTJ structure MS formed by the reactive ion etching process or the IBE process. This etching by-product is referred to as a metal redeposited metal 300.

A conductive metal redeposited metal 300 may be formed on a sidewall of the MTJ structure MS to cause an electrical short, which may cause a defect in a magnetic memory device including the MTJ structure MS. The magnetic memory device includes a memory element that changes a magnetization direction of a free layer through a quantum tunneling phenomenon through a tunnel barrier pattern 180*p* between the first magnetization pattern 160*p* and the second magnetization pattern 200*p*. Therefore, when the first magnetization pattern 160*p* and the second magnetization pattern 200*p* are electrically connected without quantum tunneling due to the conductive metal redeposited metal 300, an error may occur in stored information.

A general method to eliminate this electrical short is sought through optimizing the conditions of the reactive ion etching process or the IBE process, which is the etching process of the MTJ structure MS, optimizing the pre-etching process, or optimizing the post-etching process. In this general method, there is a limit to completely eliminating the electric short phenomenon, and even if the electrical short phenomenon is completely removed, the electrical or magnetic properties of the MTJ structure MS may be partially damaged.

Accordingly, an aspect of inventive concepts is to provide a method of manufacturing a memory device that does not cause deterioration in electrical or magnetic properties of the MTJ structure MS while substantially completely eliminating the electrical short phenomenon.

Figure 7A:
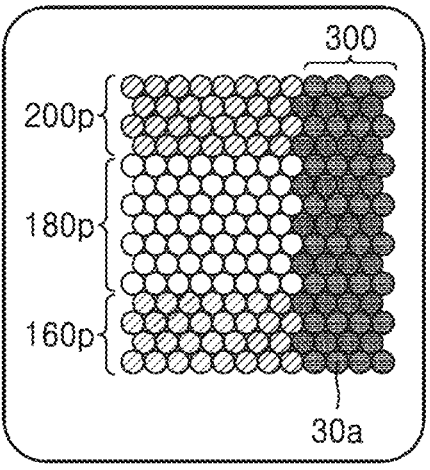
Figure 7B:
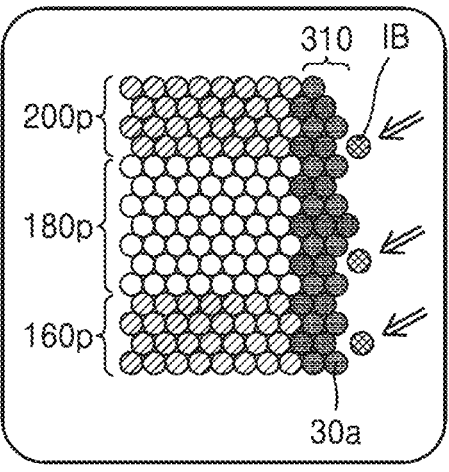
Figure 7C:
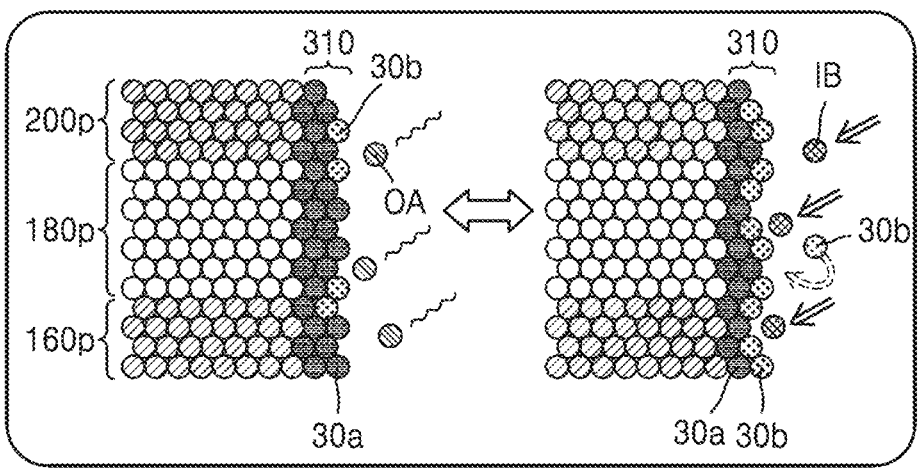

Referring to FIGS. 7A and 7B, an etching process is performed to form a metal redeposited metal 300 having a desired and/or alternatively preset thickness on the sidewall of the MTJ structure MS. In particular, FIGS. 7A, 7B, and 7C are enlarged cross-sectional views illustrating a portion BB of FIG. 6 during operations in the method of manufacturing a memory device.

In the method of manufacturing a memory device according to an embodiment of inventive concepts, the metal redeposited metal 300 may be intentionally formed to have a desired and/or alternatively preset thickness. That is, to more uniformly form the sidewall insulating layer 320 (refer to FIG. 8) by changing the metal 30*a* included in the metal redeposited metal 300 to the metal oxide 30*b*, the conditions of the etching process are intentionally controlled.

Next, an ion beam may be irradiated for dry etching the metal 30*a* constituting the metal redeposited metal 300 having a desired and/or alternatively preset thickness. The ion beam may be formed of inert gas ions IB, and the inert gas ions IB may be removed by etching a portion of the metal redeposited metal 300. Specifically, the inert gas ions IB may be helium (He), neon (Ne), or argon (Ar) ions. In other words, irradiating the ion beam may be performed through an IBE process.

Referring to FIGS. 7A and 7B, a portion of the metal redeposited metal 300 may be etched to form the sidewall metal layer 310 on the sidewall of the MTJ structure MS. The metal 30*a* constituting the sidewall metal layer 310 may be substantially the same as the metal 30*a* constituting the metal redeposited metal 300, and a thickness of the sidewall metal layer 310 may be less than a thickness of the metal redeposited metal 300.

Next, referring to FIG. 7C, the process of oxidizing the exposed surface of the sidewall metal layer 310 may be performed. The exposed surface of the sidewall metal layer 310 may be in an excited state due to an increase in surface energy according to ion beam irradiation of inert gas ions IB, and thus free electrons of the metal 30*a* may be in an excited state. In this case, the metal oxide 30*b* may be formed by combining the metal 30*a* and the oxygen atom OA on the surface of the sidewall metal layer 310 by supplying an oxygen atom OA. Here, the combination of the metal 30*a* constituting the sidewall metal layer 310 and the oxygen atom OA may be a natural oxidation process. In the natural oxidation process, the surface of the sidewall metal layer 310 may change from an unstable state to a stable state. For convenience, this is referred to as an oxidation process.

Next, a portion of the metal 30a and a portion of the metal oxide 30b may be removed by irradiating an ion beam to the oxidized surface of the sidewall metal layer 310. In this process, free electrons of the metal 30a may exist in an excited state due to an increase in surface energy according to the ion beam irradiation of the inert gas ions IB, and substantially at the same time, a portion of the removed metal oxide 30b may be reattached to the sidewall metal layer 310. During the ion beam irradiation process, the surface of the sidewall metal layer 310 may change from a stable state to an unstable state. For convenience, this is referred to as an irradiation process.

Figure 8:
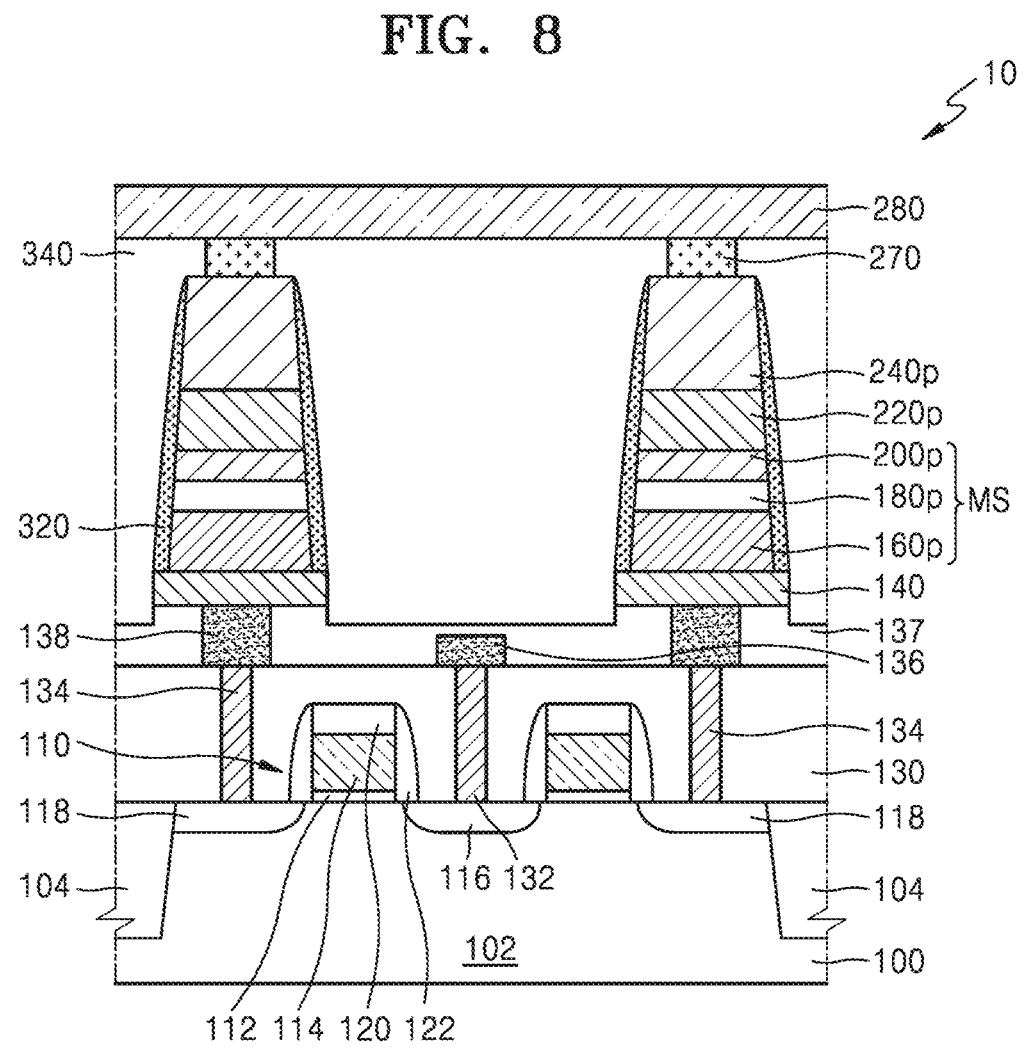

In an embodiment of inventive concepts, the oxidation process and the irradiation process are alternately performed two or more times, respectively, such that the sidewall metal layer 310 covering the sidewall of the MTJ structure MS may be changed into a sidewall insulating layer 320 (refer to FIG. 8). Also, the oxidation process and the irradiation process may be performed in one process chamber of one semiconductor manufacturing facility. In this way, by changing the metal 30a included in the sidewall metal layer 310 over several times into a high-density metal oxide 30b, the insulating effect of the sidewall insulating layer 320 (refer to FIG. 8) may be further increased.

Referring to FIG. 8, a second interlayer insulating film 340 covering the pattern structure including the MTJ structure MS is formed on the recessed lower insulating film 137.

Subsequently, an upper contact hole penetrating the second interlayer insulating film 340 and exposing the upper electrode pattern 240p is formed, and an upper contact plug 270 is formed by filling the upper contact hole with a conductive material. The upper contact plug 270 serves as an upper electrode contact. The upper contact plug 270 may include, for example, tungsten (W), copper (Cu), aluminum (Al), titanium (Ti), titanium nitride (TiN), ruthenium (Ru), or the like.

A bit line 280 extending on the second interlayer insulating film 340 while making contact with the upper contact plug 270 is formed. The bit line 280 may include, for example, tungsten (W), copper (Cu), aluminum (Al), titanium (Ti), titanium nitride (TiN), ruthenium (Ru), or the like. A metal wire electrically connected to a circuit of a peripheral circuit may be further formed on the bit line 280. In other embodiments, the upper contact plug 270 may not be formed. In this case, the bit line 280 may be connected while being in direct contact with the upper electrode pattern 240p.

Accordingly, it is possible to manufacture the magnetic memory device 10 that does not reduce the electrical or magnetic properties of the MTJ structure MS while substantially completely removing the electrical short caused by the etching by-product.

Ultimately, according to embodiments of inventive concepts, in the manufacturing process of the magnetic memory device 10, by changing the sidewall metal layer 310 to the sidewall insulating layer 320 using an oxidation process and an ion beam irradiation process to limit and/or prevent an electrical short defect that may occur due to an etching by-product of the sidewall of the MTJ structure MS, it is possible to reduce the malfunction of the magnetic memory device 10.

FIG. 9 is a flowchart illustrating a method of manufacturing a memory device according to another embodiment of inventive concepts.

Referring to FIG. 9, the method S20 of manufacturing a memory device according to an embodiment of inventive concepts may include process sequences of first to sixth operations S210 to S260.

When a certain embodiment may be implemented differently, a particular process order may be performed differently from the described order. For example, two processes described in succession may be performed substantially simultaneously, or may be performed in an order opposite to the described order.

The manufacturing method S20 of the memory device according to an embodiment of inventive concepts may include a first operation S210 of sequentially forming a first magnetization layer, a tunnel barrier layer, and a second magnetization layer, a second operation S220 of forming an MTJ structure by patterning the first magnetization layer, the tunnel barrier layer, and the second magnetization layer, a third operation S230 of forming a sidewall metal layer by etching a part of the metal redeposited metal covering the sidewall of the MTJ structure, a fourth operation S240 of oxidizing the exposed surface of the sidewall metal layer by irradiating oxygen ions with an ion beam, a fifth operation S250 of etching the oxidized sidewall metal layer by irradiating an inert gas ion with an ion beam, and a sixth operation S260 of forming a sidewall insulating layer covering the sidewall of the MTJ structure by performing the fourth operation S240 and the fifth operation S250 simultaneously in one chamber.

Technical features for each of the first to sixth operations S210 to S260 will be described in detail with reference to FIGS. 10 to 12 to be described later.

Figure 10:
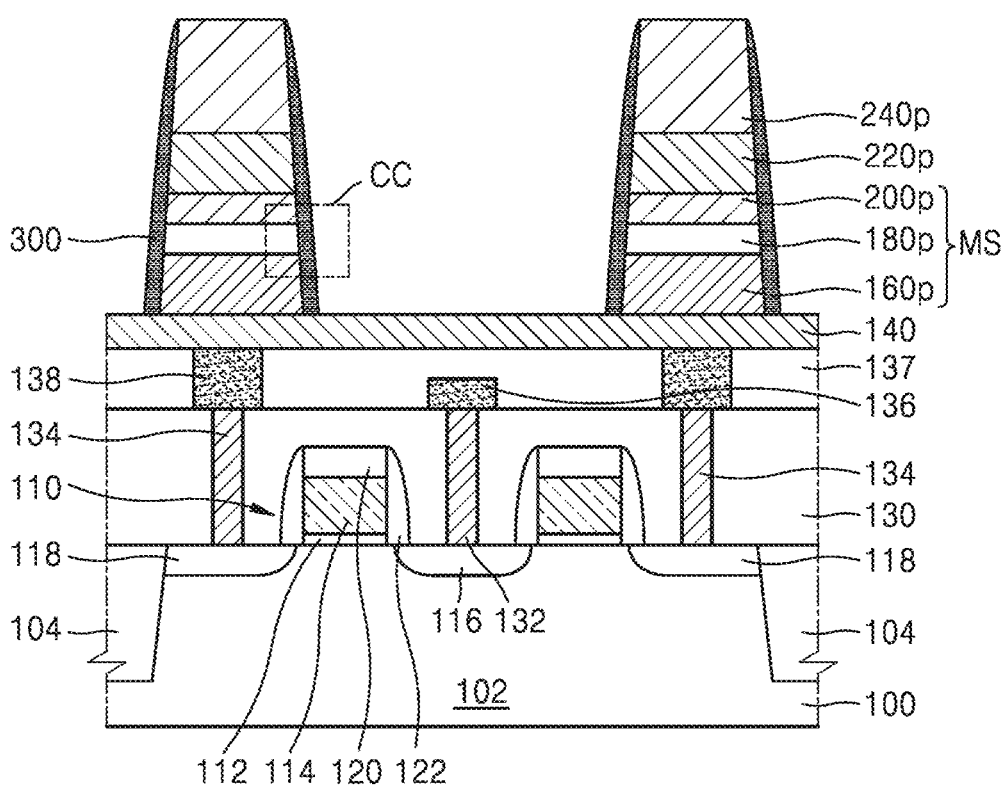
FIGS. 10 to 12 are cross-sectional views illustrating a method of manufacturing a memory device according to another example embodiment of inventive concepts.
Figure 11A:
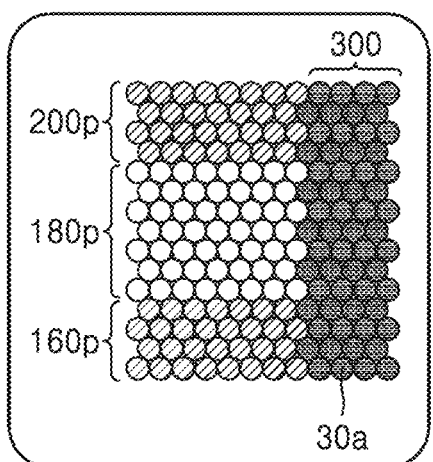
Figure 11B:
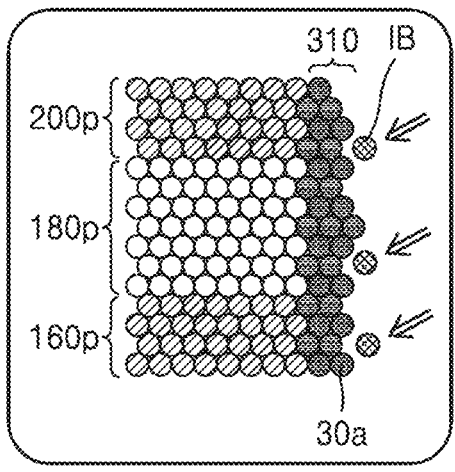
Figure 11C:
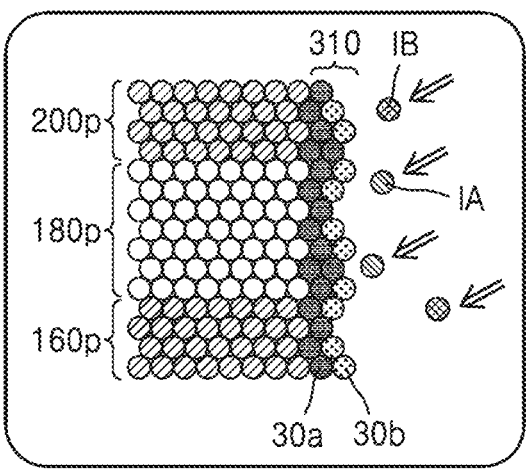
Figure 12:
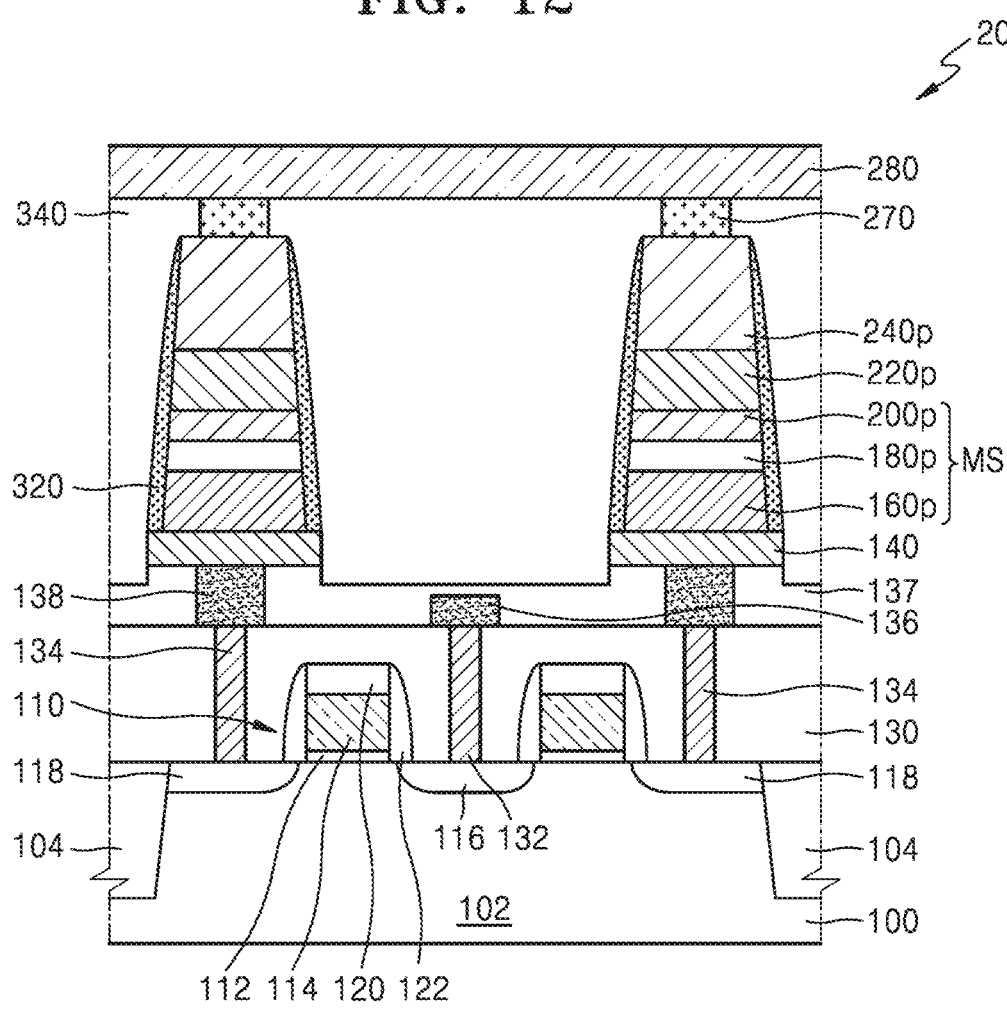

FIGS. 10 to 12 are cross-sectional views illustrating a method of manufacturing a memory device according to another example embodiment of inventive concepts.

A method of manufacturing a memory device to be described below is similar to that described above with reference to FIGS. 3 to 8, except for some differences. Therefore, for convenience of description, the description focuses on differences from the manufacturing method of the memory device described above.

Referring to FIG. 10, when the etch target film including the magnetic material is etched, a portion of the etched material may be redeposited on the sidewall of the pattern structure including the MTJ structure MS.

Etching by-products are redeposited on the sidewalls of the MTJ structure MS including the first magnetization pattern 160p, the tunnel barrier pattern 180p, and the second magnetization pattern 200p formed by the reactive ion etching process or the IBE process. This etching by-product is referred to as a metal redeposited metal 300.

Referring to FIGS. 11A and 11B, an etching process is performed to form a metal redeposited metal 300 having a desired and/or alternatively preset thickness on the sidewall of the MTJ structure MS. In particular, FIGS. 11A, 11B, and 11C are enlarged cross-sectional views illustrating a portion CC of FIG. 10 in operations of a method of manufacturing a memory device.

In the method of manufacturing a memory device according to an embodiment of inventive concepts, the metal redeposited metal 300 may be intentionally formed to have a desired and/or alternatively preset thickness. That is, to more uniformly form the sidewall insulating layer 320 (refer to FIG. 12) by changing the metal 30a included in the metal redeposited metal 300 to the metal oxide 30b, the conditions of the etching process are intentionally controlled.

Referring to FIGS. 11A and 11B, a portion of the metal redeposited metal 300 may be etched to form the sidewall metal layer 310 on the sidewall of the MTJ structure MS. The metal 30a constituting the sidewall metal layer 310 may be substantially the same as the metal 30a constituting the metal redeposited metal 300, and a thickness of the sidewall metal layer 310 may be less than a thickness of the metal redeposited metal 300.

Next, referring to FIG. 11C, oxygen ions IA penetrate through the portion where the sidewall metal layer 310 is removed by the inert gas ions IB such that a metal oxide 30b may be formed by reacting with a portion of the metal 30a of the sidewall metal layer 310.

In an embodiment of inventive concepts, the process of oxidizing the metal 30a may be performed by irradiating the exposed surface of the sidewall metal layer 310 with an ion beam of oxygen ions IA. At substantially the same time, a portion of the metal 30a and a portion of the metal oxide 30b may be removed by irradiating an ion beam of inert gas ions IB to the oxidized surface of the sidewall metal layer 310. In this process, free electrons of the metal 30a may exist in an excited state due to an increase in surface energy according to the ion beam irradiation of the inert gas ions IB, and substantially at the same time, a portion of the removed metal oxide 30b may be reattached to the sidewall metal layer 310.

By simultaneously performing the ion beam irradiation process of oxygen ions IA and the ion beam irradiation process of inert gas ions IB, the sidewall metal layer 310 covering the sidewall of the MTJ structure MS may be changed into a sidewall insulating layer 320 (refer to FIG. 12). Also, the ion beam irradiation process may be performed in one process chamber of one semiconductor manufacturing facility. Moreover, by adjusting the angle of the ion beam, the energy of the ion beam, and/or the dose of oxygen ions IA, the sidewall metal layer 310 may be oxidized while oxygen ions IA are not diffused into the MTJ structure MS.

Referring to FIG. 12, a second interlayer insulating film 340 covering the pattern structure including the MTJ structure MS is formed on the recessed lower insulating film 137.

Subsequently, an upper contact hole penetrating the second interlayer insulating film 340 and exposing the upper electrode pattern 240p is formed, and an upper contact plug 270 is formed by filling the upper contact hole with a conductive material. The upper contact plug 270 serves as an upper electrode contact.

A bit line 280 extending on the second interlayer insulating film 340 while making contact with the upper contact plug 270 is formed. A metal wire electrically connected to a circuit of a peripheral circuit may be further formed on the bit line 280. In other embodiments, the upper contact plug 270 may not be formed. In this case, the bit line 280 may be connected while being in direct contact with the upper electrode pattern 240p.

Accordingly, it is possible to manufacture the magnetic memory device 20 that does not reduce the electrical or magnetic properties of the MTJ structure MS while substantially completely removing the electrical short caused by the etching by-product.

Ultimately, according to an embodiment of inventive concepts, in the manufacturing process of the magnetic memory device 20, by changing the sidewall metal layer 310 to the sidewall insulating layer 320 using an oxidation process and an ion beam irradiation process to limit and/or prevent an electrical short defect that may occur due to an etching by-product of the sidewall of the MTJ structure MS, it is possible to reduce the malfunction of the magnetic memory device 20.

FIG. 13 is a flowchart illustrating a method of manufacturing a memory device according to another embodiment of inventive concepts.

Referring to FIG. 13, the method S30 of manufacturing a memory device according to an embodiment of inventive concepts may include process sequences of first to sixth operations S310 to S360.

When a certain embodiment may be implemented differently, a particular process order may be performed differently from the described order. For example, two processes described in succession may be performed substantially simultaneously, or may be performed in an order opposite to the described order.

The manufacturing method S30 of the memory device according to an embodiment of inventive concepts may include a first operation S310 of sequentially forming a first magnetization layer, a tunnel barrier layer, and a second magnetization layer, a second operation S320 of forming an MTJ structure by patterning the first magnetization layer, the tunnel barrier layer, and the second magnetization layer, a third operation S330 of forming a sidewall metal layer by etching a part of the metal redeposited metal covering the sidewall of the MTJ structure, a fourth operation S340 of alternately performing the process of oxidizing the exposed surface of the sidewall metal layer and the process of irradiating the first ion beam of inert gas ions to the oxidized sidewall metal layer twice or more, respectively, a fifth operation S350 of performing the process of irradiating a second ion beam including reactive ions and inert gas ions to the exposed surface of the sidewall metal layer, and a sixth operation S360 of forming a sidewall insulating layer covering the sidewall of the MTJ structure through the fourth operation S340 and the fifth operation S350.

Technical characteristics for each of the first to sixth operations S310 to S360 are similar to those described above in FIGS. 3 to 8 except for some differences. Therefore, for convenience of description, the description focuses on differences from the manufacturing method of the memory device described above.

Referring again to FIGS. 3 to 8, the process of oxidizing the exposed surface of the sidewall metal layer 310 may be performed. The metal oxide 30b may be formed by supplying oxygen atoms OA to induce bonding between the metal 30a and oxygen atoms OA on the surface of the sidewall metal layer 310. A portion of the metal 30a and a portion of the metal oxide 30b may be removed by irradiating a first ion beam of inert gas ions IB to the oxidized surface of the sidewall metal layer 310. In this process, free electrons of the metal 30a may exist in an excited state due to an increase in surface energy according to the first ion beam irradiation of the inert gas ions IB, and substantially at the same time, a portion of the removed metal oxide 30b may be reattached to the sidewall metal layer 310. The oxidation process and the irradiation process of the first ion beam are alternately performed two or more times, respectively.

Next, by irradiating a second ion beam including oxygen ions IA and inert gas ions IB to the exposed surface of the sidewall metal layer 310, a metal oxide 30b is formed by inducing a bond between the metal 30a and oxygen ions IA on the surface of the sidewall metal layer 310, and at the same time, a portion of the metal 30a and a portion of the metal oxide 30b may be removed.

The oxidation process, the first ion beam irradiation process, and the subsequent second ion beam irradiation process may be performed in one process chamber of one semiconductor manufacturing facility. As described above, by changing the metal 30a included in the sidewall metal layer 310 to the high-density metal oxide 30b several times, the insulating effect of the sidewall insulating layer 320 may be further enhanced.

Figure 14:
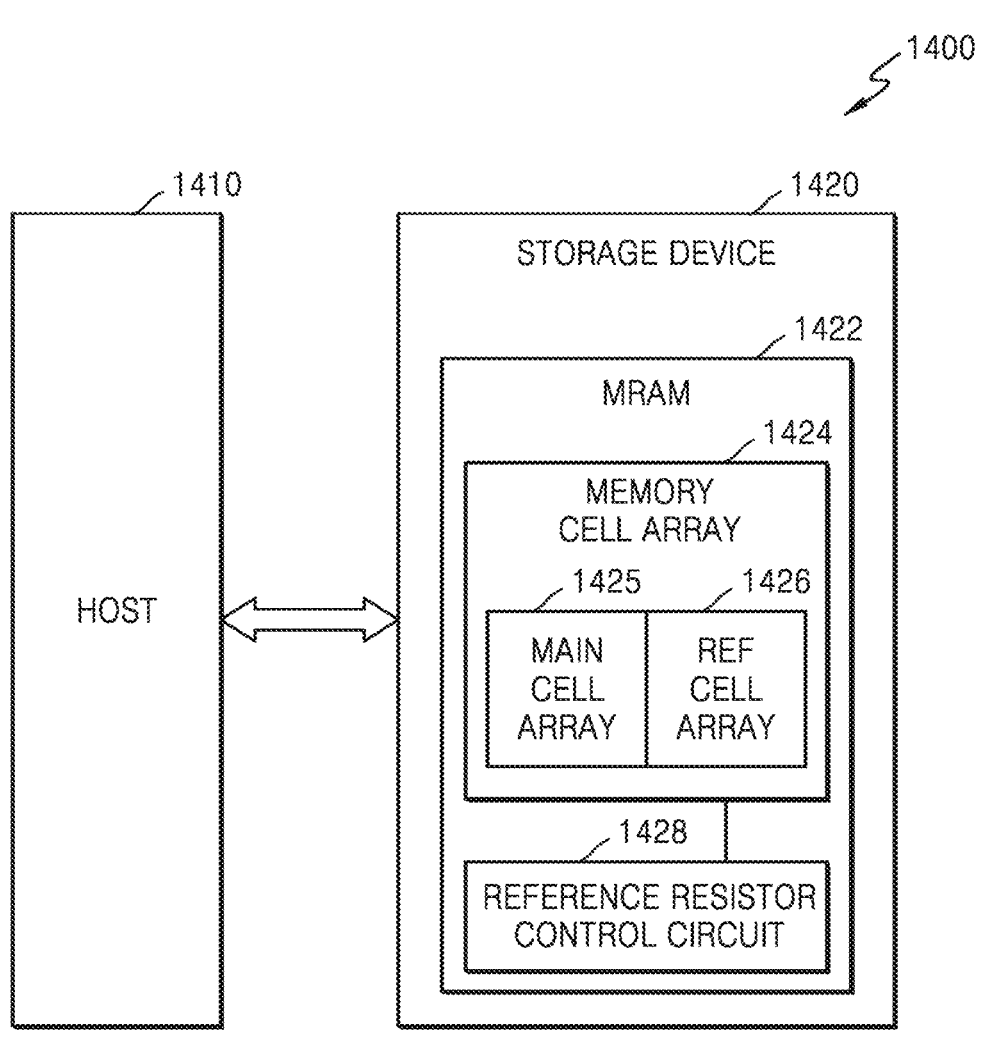
FIG. 14 is a block diagram illustrating an electronic device including a magnetic memory device manufactured

FIG. 14 is a block diagram illustrating an electronic device including a magnetic memory device manufactured by a method of manufacturing a memory device according to an embodiment of inventive concepts.

Referring to FIG. 14, an electronic device 1400 includes a host 1410 and a storage device 1420.

The host 1410 may include a user device such as a personal/portable computer, a tablet PC, a personal digital assistant (PDA), a portable media player (PMP), a digital camera, a camcorder, and the like. The host 1410 stores data in or reads data from the storage device 1420 through an input/output request.

The host 1410 may be connected to the storage device 1420 through an interface such as Universal Serial Bus (USB), Multimedia Card (MMC), Peripheral Component Interconnection (PCI), PCI-Express (PCI-E), Advanced Technology Attachment (ATA), Serial-ATA, Parallel-ATA, Small Computer Small Interface (SCSI), Enhanced Small Disk Interface (ESD), or Integrated Drive Electronics (IDE).

The storage device 1420 is a data storage unit for performing a write operation or a read operation according to an input/output request of the host 1410, and may include a magnetic memory device 1422. The magnetic memory device 1422 includes a memory cell array 1424 and a reference resistor control circuit 1428, and the memory cell array 1424 includes a main cell array 1425 and a reference cell array 1426. The magnetic memory device 1422 may be manufactured by the method of manufacturing the memory device according to the embodiment of inventive concepts described above.

Main cells including a first cell transistor and a first variable resistance element are arranged in the main cell array 1425 and bit lines of the main cells are provided as a sense amplifier. Reference cells including the second cell transistor and the short-circuited second variable resistance element are arranged in the reference cell array 1426, and the reference bit line of the reference cell is provided to the sense amplifier.

The reference resistor control circuit 1428 generates a reference resistor instead of the short-circuited second variable resistor of the reference cell and provides the reference resistor as a reference bit line. The sense amplifier improves the sensing margin of the main cell by sensing and amplifying the current flowing through the bit line of the main cell and the reference bit line of the reference cell to which the reference resistor is connected. The main cell may be a selected main cell in the main cell array 1425. The reference cell may be a selected reference cell in the reference cell array 1426.

FIG. 15 is a block diagram illustrating a server system including a magnetic memory device manufactured by a method of manufacturing a memory device according to an embodiment of inventive concepts.

Referring to FIG. 15, the server system 1500 includes a server 1510 and at least one storage device 1520 for storing data required to operate the server 1510.

The server 1510 includes an application communication controller 1511, a data processing controller 1512, an upgrade module 1513, a scheduling center 1514. a local resource module 1515, and a repair information module 1516. The application communication controller 1511 is implemented to communicate with the server 1510 and a computing system connected to the network, or communicate with the server 1510 and the storage device 1520. The application communication controller 1511 transmits data or information provided through the user interface to the data processing controller 1512.

The data processing controller 1512 is linked to the local resource module 1515. The local resource module 1515 provides a list of repair shops, dealers, and technical information based on data or information connected to the server 1510. The upgrade module 1513 interfaces with the data processing controller 1512. The upgrade module 1513 upgrades firmware, a reset code, a diagnostic system upgrade, or other information to the electronic device based on data or information transmitted from the storage device 1520.

The scheduling center 1514 allows real-time options to the user based on data or information input to the server 1510. The repair information module 1516 interfaces with the data processing controller 1512. The repair information module 1516 is used to provide repair-related information to a user, for example, an audio, video, or document file. The data processing controller 1512 packages related information based on the information transmitted from the storage device 1520. Next, this information is transmitted to the storage device 1520 or displayed to the user. The storage device 1520 may include a magnetic memory device 1522 as a data storage unit.

The magnetic memory device 1522 includes a memory cell array 1524 and a reference resistor control circuit 1528, and the memory cell array 1524 includes a main cell array 1525 and a reference cell array 1526. The magnetic memory device 1522 may be manufactured by the method of manufacturing the memory device according to the embodiment of inventive concepts described above.

Main cells including a first cell transistor and a first variable resistance element are arranged in the main cell array 1525 and bit lines of the main cells are provided as a sense amplifier. Reference cells including the second cell transistor and the short-circuited second variable resistance element are arranged in the reference cell array 1526, and the reference bit line of the reference cell is provided to the sense amplifier.

The reference resistor control circuit 1528 generates a reference resistor instead of the short-circuited second variable resistor of the reference cell and provides the reference resistor as a reference bit line. The sense amplifier improves the sensing margin of the main cell by sensing and amplifying the current flowing through the bit line of the main cell and the reference bit line of the reference cell to which the reference resistor is connected. The main cell may be a selected main cell in the main cell array 1525. The reference cell may be a selected reference cell in the reference cell array 1526.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. A method of manufacturing a memory device, the method comprising:

sequentially forming a first magnetization layer, a tunnel barrier layer, and a second magnetization layer on each other;

forming a magnetic tunnel junction structure by patterning the first magnetization layer, the tunnel barrier layer, and the second magnetization layer, the forming the magnetic tunnel junction structure including forming a redeposited metal covering a sidewall of the magnetic tunnel junction structure;

forming a sidewall metal layer by etching a portion of the redeposited metal;

performing an oxidizing operation that includes oxidizing an exposed surface of the sidewall metal layer to provide an oxidized portion of the sidewall metal layer; and performing an irradiating operation that includes irradiating an ion beam toward the oxidized portion of the sidewall metal layer, wherein a sidewall insulating layer covers a sidewall of the magnetic tunnel junction structure and is formed by alternately performing the oxidizing operation and the irradiating operation two or more times.

2. The method of claim 1, wherein in performing the oxidizing operation, as a surface energy of the sidewall metal layer increases according to irradiation of the ion beam in the irradiating operation, a metal on the exposed surface of the sidewall metal layer bonds with oxygen atoms.

3. The method of claim 2, wherein the metal on the exposed surface of the sidewall metal layer bonds with the oxygen atoms according to a natural oxidation process.

4. The method of claim 1, wherein, in the performing the irradiating operation, the ion beam removes a portion of a metal and a portion of a metal oxide from a surface of the oxidized portion of the sidewall metal layer.

5. The method of claim 4, wherein a portion of the removed portion of the metal oxide is re-attached to the sidewall metal layer.

6. The method of claim 1, wherein the sidewall insulating layer comprises a metal oxide, a metal constituting the metal oxide and a metal constituting the sidewall metal layer are substantially a same metal.

7. The method of claim 1, wherein, in the performing the oxidizing operation, a surface of the sidewall metal layer is changed from an unstable state to a stable state, wherein, in the performing the irradiating operation, the surface of the sidewall metal layer is changed from the stable state to the unstable state.

8. The method of claim 1, wherein in the performing the irradiating operation, the irradiating the ion beam is performed during an ion beam etching process, and the ion beam comprises inert gas ions.

9. The method of claim 1, wherein, in the forming the sidewall metal layer, a remaining unetched portion of the redeposited metal constitutes the sidewall metal layer.

10. The method of claim 1, wherein the performing the oxidizing operation and the performing the irradiating operation are performed in one process chamber.

11. A method of manufacturing a memory device, the method comprising:

sequentially forming a first magnetization layer, a tunnel barrier layer, and a second magnetization layer on each other;

forming a magnetic tunnel junction structure by patterning the first magnetization layer, the tunnel barrier layer, and the second magnetization layer, the forming the magnetic tunnel junction structure including forming a redeposited metal covering a sidewall of the magnetic tunnel junction structure;

forming a sidewall metal layer by etching a portion of a redeposited metal;

performing an oxidizing operation that includes oxidizing an exposed surface of the sidewall metal layer by irradiating an ion beam of oxygen ions toward the exposed surface of the sidewall metal layer to provide an oxidized portion of the sidewall metal layer; and etching the oxidized portion of the sidewall metal layer by irradiating an ion beam of inert gas ions toward the oxidized portion of the sidewall metal layer, and the performing the oxidizing operation and the performing etching operation being performed in one chamber at a same time to form a sidewall insulating layer covering the sidewall of the magnetic tunnel junction structure.

12. The method of claim 11, wherein, in performing the oxidizing operation, as a surface energy increases according to irradiation of the ion beam of oxygen ions, a metal is combined with the oxygen ions on the exposed surface of the sidewall metal layer.

13. The method of claim 11, wherein the ion beam of oxygen ions oxidizes a portion of the redeposited metal at the exposed surface of the sidewall metal layer, and the ion beam of inert gas ions removes a portion of the metal and a portion of metal oxide from the surface of the oxidized portion of the sidewall metal layer.

14. The method of claim 13, wherein a portion of the removed portion of the metal oxide, removed by the ion beam of the inert gas ions, is re-attached to the sidewall metal layer.

15. The method of claim 11, wherein, in the forming the magnetic tunnel junction structure, the redeposited metal is an etching by-product in which a portion of the first magnetization layer and a portion of the second magnetization layer are etched and reattached to the sidewall of the magnetic tunnel junction structure.

16. A method of manufacturing a memory device, the method comprising:

sequentially forming a first magnetization layer, a tunnel barrier layer, and a second magnetization layer on each other;

forming a magnetic tunnel junction structure by patterning the first magnetization layer, the tunnel barrier layer, and the second magnetization layer, the forming the magnetic tunnel junction structure including forming a redeposited metal covering a sidewall of the magnetic tunnel junction structure;

forming a sidewall metal layer by etching a portion of the redeposited metal; and forming a sidewall insulating layer covering the sidewall of the magnetic tunnel junction structure by oxidizing the sidewall metal layer, the forming the sidewall insulating layer including alternately performing a process of oxidizing of an exposed surface of the sidewall metal layer to provide an oxidized sidewall of the metal layer and a process of irradiating the oxidized sidewall of the metal layer with a first ion beam of inert gas ions, and the forming the sidewall insulating layer, after the alternately performing the process of oxidizing and the process of irradiating is performed two or more times, further including an operation of irradiating the exposed surface of the sidewall metal layer with a second ion beam including reactive ions and inert gas ions.

17. The method of claim 16, wherein, in the process of oxidizing during the forming the sidewall insulating layer, a surface of the sidewall metal layer changes from an unstable state to a stable state, and in the process of irradiating the oxidized sidewall of the metal layer with the first ion beam during the forming the sidewall insulating layer, the surface of the sidewall metal layer changes from the stable state to the unstable state.

18

18. The method of claim 16, wherein in the forming the sidewall insulating layer, the process of irradiating the oxidized sidewall of the metal layer with the first ion beam is an etching process using the inert gas ions.

19. The method of claim 16, wherein in the forming the sidewall insulating layer, the irradiating the exposed surface of the sidewall metal layer with the second ion beam comprises an oxidation process using the reactive ions and an etching process using the inert gas ions.

20. The method of claim 16, wherein in the forming the sidewall insulating layer, the process of irradiating the oxidized sidewall of the metal layer with the first ion beam and the operation of irradiating the exposed sidewall of the metal layer with the second ion beam are performed in one process chamber.

* * * * *